United States Patent
Wang et al.

(10) Patent No.: US 11,189,589 B2
(45) Date of Patent: Nov. 30, 2021

(54) SEMICONDUCTOR STRUCTURE WITH RAISED IMPLANTED REGION AND MANUFACTURING METHOD THEREOF

(71) Applicant: TAIWAN SEMICONDUCTOR MANUFACTURING COMPANY LTD., Hsinchu (TW)

(72) Inventors: Ching Shan Wang, Hsinchu (TW); Cheng Hsun Hsieh, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 127 days.

(21) Appl. No.: 16/583,226

(22) Filed: Sep. 25, 2019

(65) Prior Publication Data
US 2021/0091034 A1    Mar. 25, 2021

(51) Int. Cl.
*H01L 23/00*       (2006.01)
*H01L 23/31*       (2006.01)
*H01L 23/498*      (2006.01)
*H01L 23/29*       (2006.01)

(52) U.S. Cl.
CPC ............ *H01L 24/29* (2013.01); *H01L 23/291* (2013.01); *H01L 23/315* (2013.01); *H01L 23/49816* (2013.01); *H01L 24/13* (2013.01); *H01L 2224/00* (2013.01)

(58) Field of Classification Search
CPC ............................... H01L 24/29; H01L 23/291
USPC ........................................................ 257/774
See application file for complete search history.

(56) References Cited

U.S. PATENT DOCUMENTS

| | | | |
|---|---|---|---|
| 6,225,204 B1* | 5/2001 | Wu | H01L 21/76813 257/E21.579 |
| 2003/0134471 A1* | 7/2003 | Su | H01L 21/3211 438/257 |
| 2010/0197111 A1* | 8/2010 | Seo | H01L 45/16 438/430 |
| 2015/0162397 A1* | 6/2015 | Chiou | H01L 27/0248 257/529 |
| 2015/0179579 A1* | 6/2015 | Jezewski | H01L 23/5226 257/753 |

* cited by examiner

*Primary Examiner* — Lex H Malsawma
*Assistant Examiner* — Xia L Cross
(74) *Attorney, Agent, or Firm* — WPAT, P.C., Intellectual Property Attorneys; Anthony King

(57) ABSTRACT

A semiconductor structure and manufacturing method thereof are provided. The semiconductor structure includes a metallization structure with a top surface. A conductive pad is over the top surface. An upper passivation layer is over the top surface and the conductive pad and includes a first implanted region. A polymer layer is over the upper passivation layer and the conductive pad. A conductive via penetrates through the upper passivation layer and the polymer layer, and electrically coupled to the conductive pad. A method for manufacturing a semiconductor structure is also provided.

20 Claims, 13 Drawing Sheets

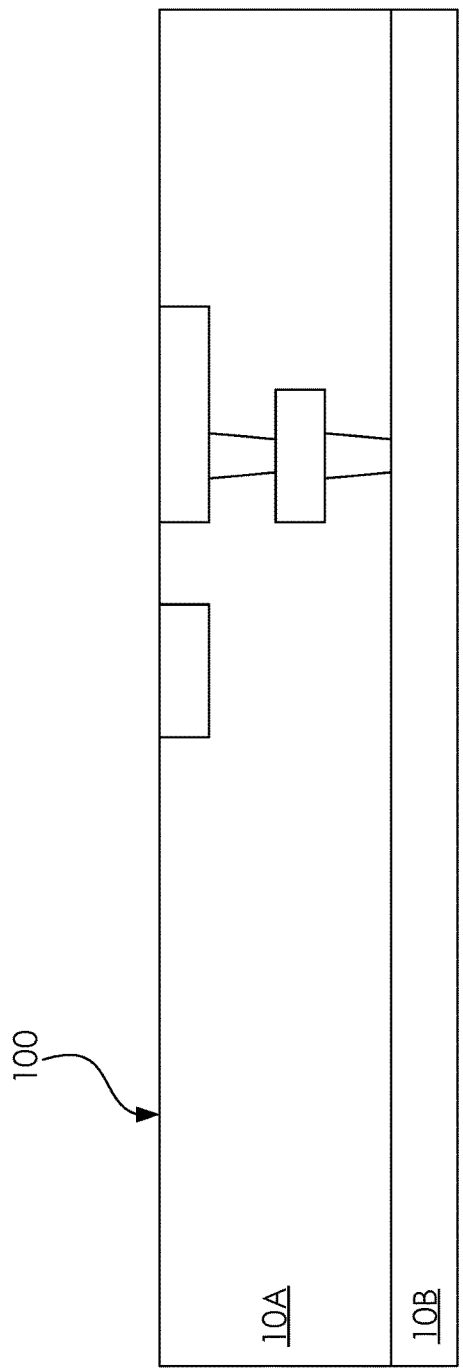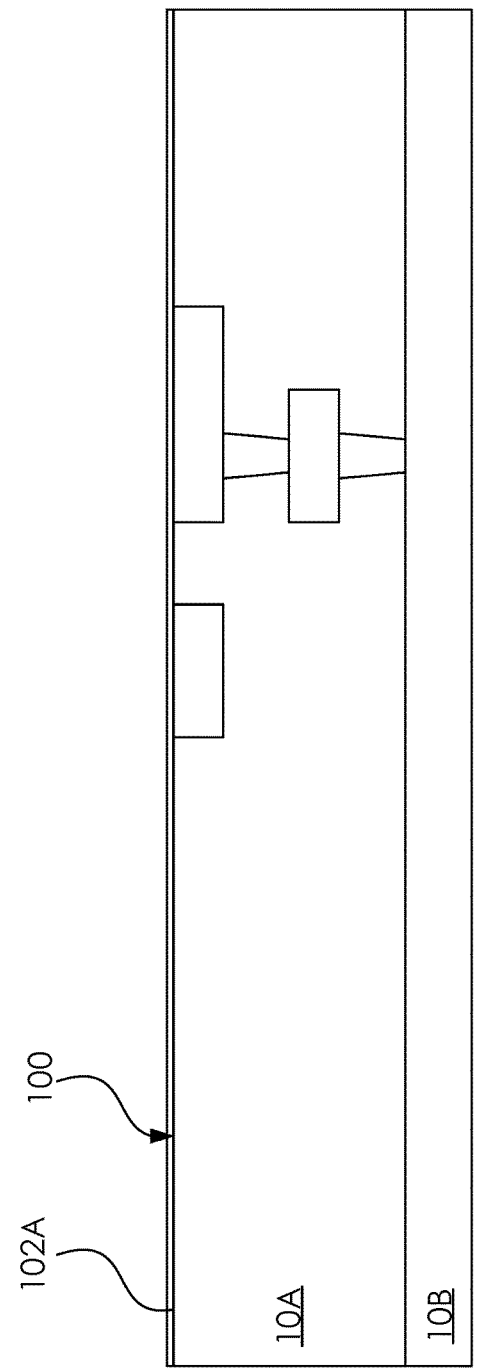

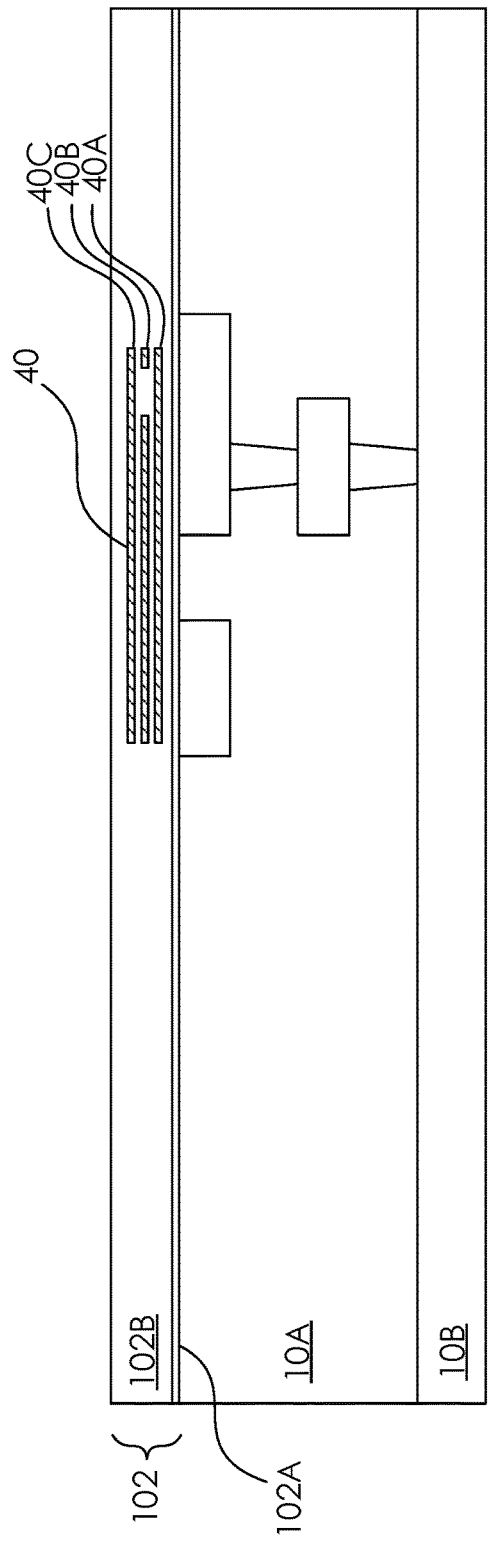
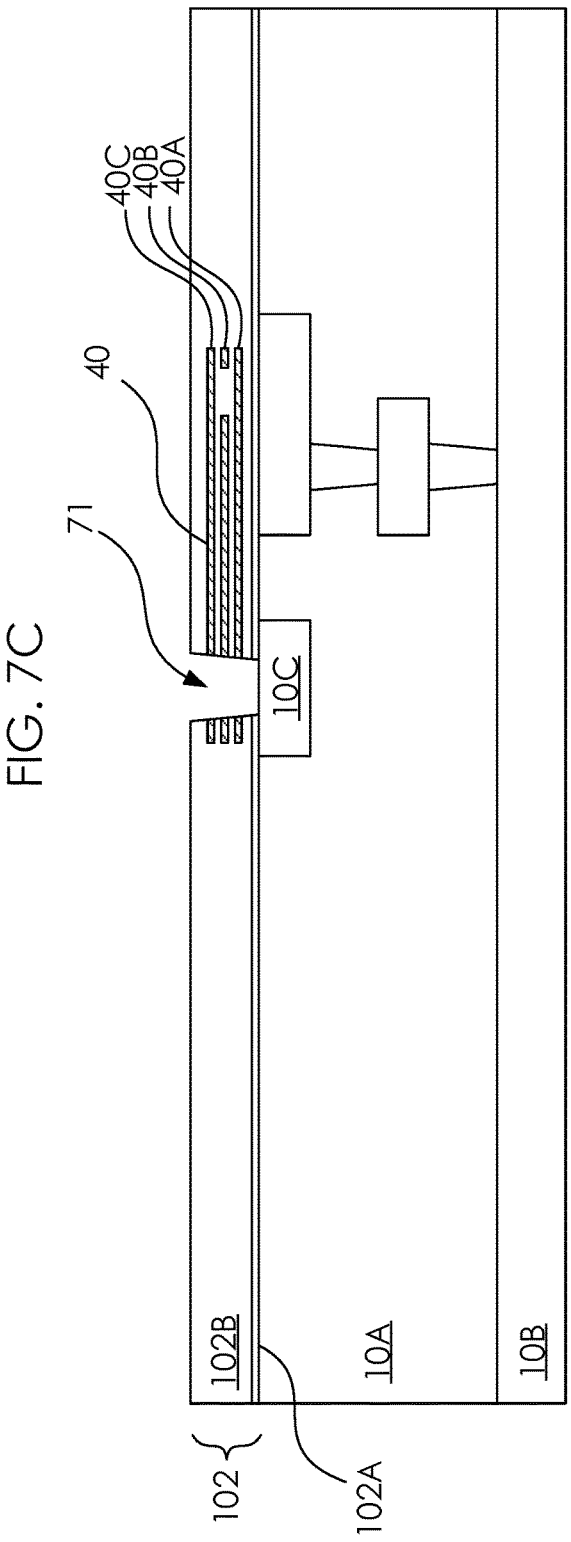

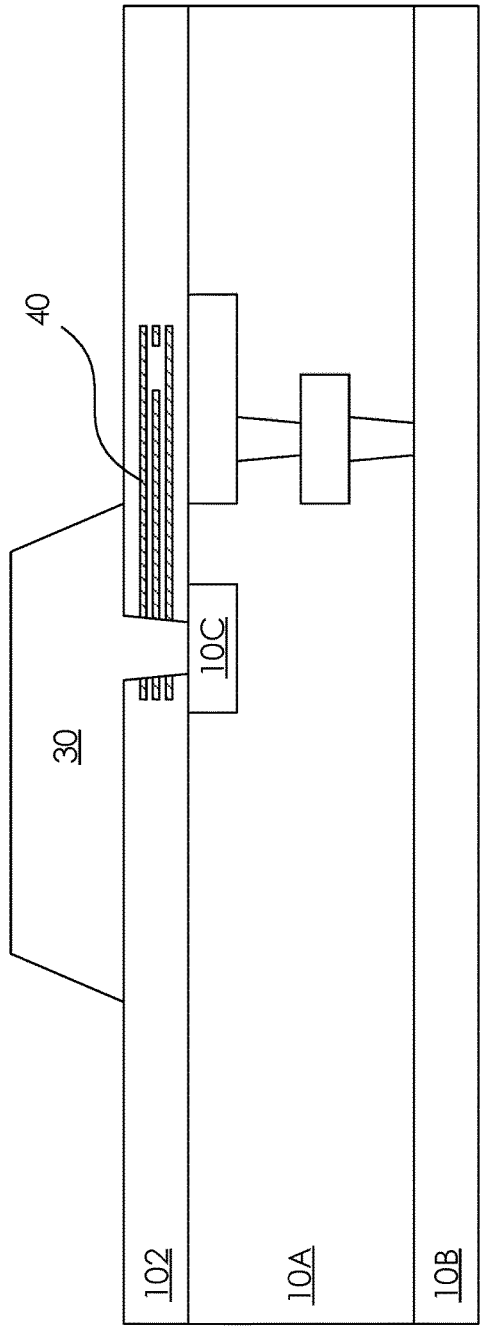
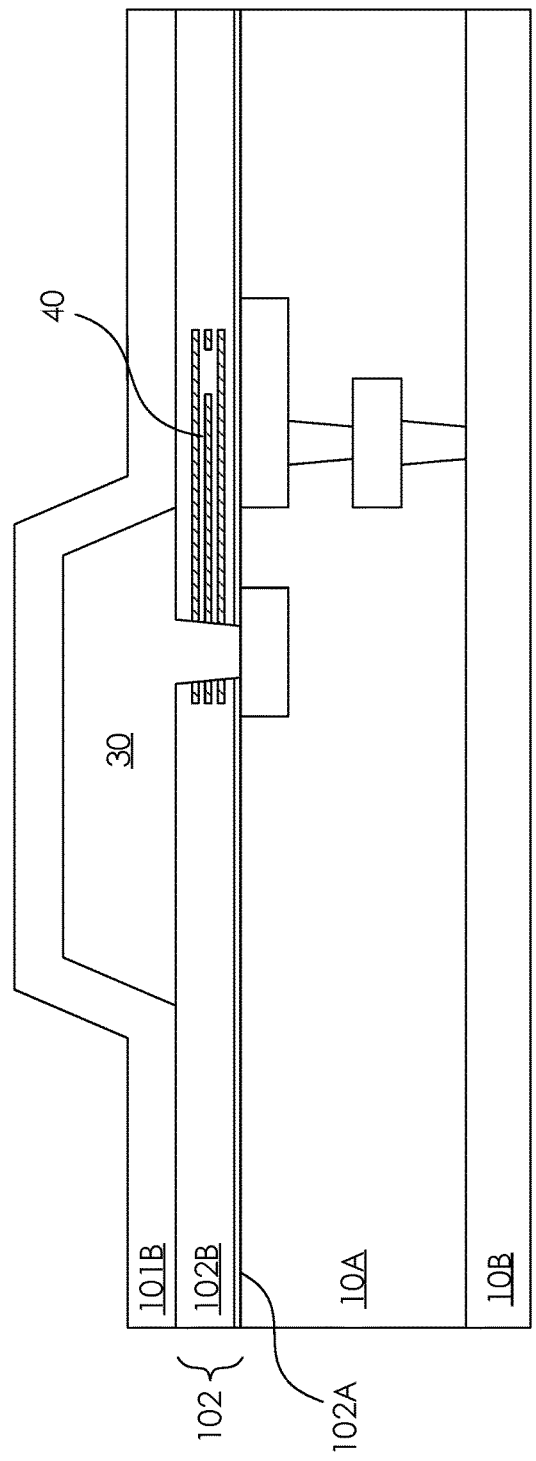

SEMICONDUCTOR STRUCTURE WITH RAISED IMPLANTED REGION AND MANUFACTURING METHOD THEREOF

FIELD

The present disclosure is related to a semiconductor structure, more particularly, to a semiconductor structure with an implanted region in the passivation layer.

BACKGROUND

In the manufacturing technology of integrated circuits, metal lines of the various layers of conducting lines in a semiconductor device are separated by insulating layers that are deposited using chemical vapor deposition (CVD) techniques. The insulating layers are deposited over patterned layers of interconnecting lines where electrical contact between successive layers of interconnecting lines is established with metal vias created for this purpose in the insulating layers. Electrical contact to the chip is typically established by means of bonding pads that form electrical interfaces with patterned levels of interconnecting metal lines. Signal lines and power/ground lines can be connected to the bonding pads. After the bonding pads have been created on the surfaces of the chip package, the bonding pads are passivated and electrically insulated by the deposition of a passivation layer over the surface of the bonding pads. Such passivation layer may insulate and protect the surface of the chips from moisture and other contaminants and from mechanical damage during the final assembling of the chips.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

FIGS. 7A to 7J illustrate cross-sectional views at various operations of manufacturing a semiconductor structure according to some embodiments of the present disclosure.

DETAILED DESCRIPTION

Figure 1:
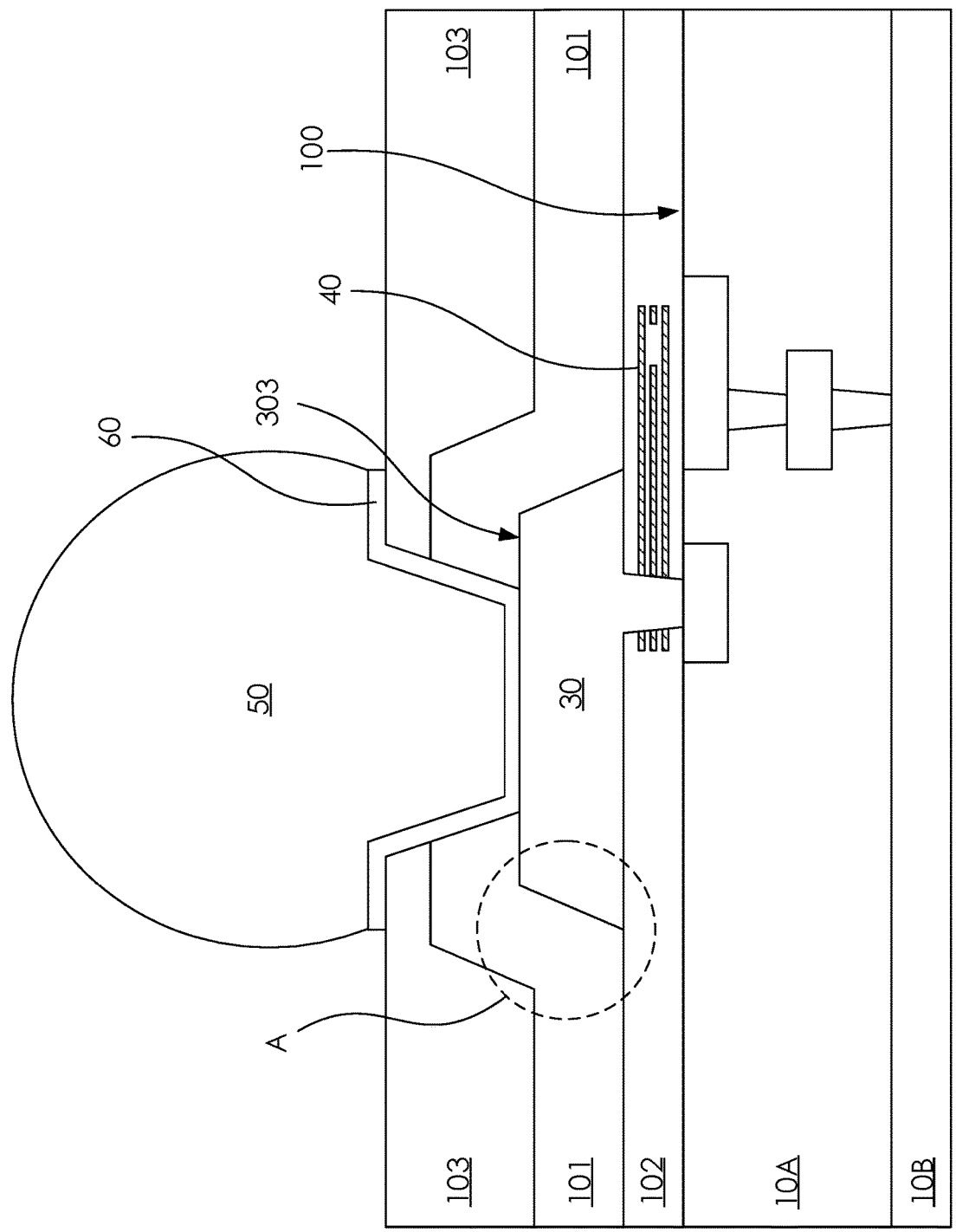
FIG. 1 illustrates a cross-sectional view of a semiconductor structure according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second", and "third" when used herein do not imply a sequence or order unless clearly indicated by the context.

Reliability of the integrated circuits (ICs) is one of the major concerns for semiconductor industry. Thermo-mechanical failures, such as passivation cracks, pattern shift, loose bond balls, wire break, voids, buckling, hillocks, delamination, and/or debonding, are often observed during manufacturing processes, qualification tests and field applications.

The stress in the semiconductor structure may be caused by thermal, mechanical and chemical mechanisms. For instance, difference in effective coefficient of thermal expansion (CTE) between passivation layer (e.g., dielectrics) and conductive pads (e.g., metal) may bring the outcome of cracking at the passivation layer. Also, the bonding pressure from the copper bump to the bonding pad may increase the stress suffered by the chip, and consequently, the structures inside the chip including the passivation layer, metal-insulator-metal (MIM) structure underlying the conductive pad and the passivation layer, also may be cracked and result in device failure.

In some comparative embodiments, the cracks generated in the passivation layer surrounding conductive pads may further propagate to the underlying structures, including lower passivation layer or MIM structures, exposing the underlying structures to the harmful ambient environment or even causing device failure.

The present disclosure provides a semiconductor structure having at least an implanted region in the passivation layer surrounding the conductive pad, for example, an aluminum pad, over a top surface of metallization. The implanted region in the passivation layer reduces passivation film stress by bringing the CTE of the passivation layer closer to that of the conductive pad. As a result, CTE difference between the passivation layer and the conductive pad can be effectively reduced, and the crack-inducing stress can be reduced accordingly.

As shown in FIG. 1, in some embodiments, the semiconductor structure of the present disclosure includes a metallization structure 10A having a top surface 100, a conductive pad 30, an upper passivation layer 101, a polymer layer 103, and a conductive via or a conductive bump 50.

The metallization structure 10A may include a series of stacked layers over a substrate 10B. The substrate 10B may include, for example, bulk silicon, doped or undoped, or an active layer of a semiconductor-on-insulator (SOI) substrate. Generally, a SOI substrate may comprise a layer of a semiconductor material formed on an insulator layer. The insulator layer may be a buried oxide (BOX) layer or a silicon oxide layer. The insulator layer is provided on a silicon substrate or a glass substrate. Alternatively, the substrate 10B may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP, or combinations thereof. Other options such as multi-layered or gradient substrates may also be used.

The metallization structure 10A over the substrate 10B may be fabricated to provide individual devices such as transistors, capacitors, resistors, diodes, photo-diodes, fuses, and the like, to get interconnected with electrical contacts and vias over the substrate 10B. The stacked layers may include inter-layer dielectric (ILD) and/or inter-metal dielectric (IMD) layers containing conductive lines formed using any suitable method. The ILD and IMDs may include low-k dielectric materials or extreme low-k (ELK) dielectric materials having k values less than about 4.0 or even about 2.5, such as SiOC, SiOCN and SiCOH, disposed between the conductive lines. In some embodiments, the ILD and IMDs may be made by undoped silicate glass (USG), phosphosilicate glass (PSG), borophosphosilicate glass (BPSG), fluorosilicate glass (FSG), SiOxCy, Spin-On-Glass, Spin-On-Polymers, silicon carbon material, or the like. The metallization structure 10A may be formed by any suitable method, such as spinning, chemical vapor deposition (CVD), and plasma-enhanced chemical vapor deposition (PECVD). In some embodiments, the metallization structure 10A is a back end of line (BEOL) structure or the devices thereof.

The conductive pad 30 is disposed on the top surface 100 of the metallization structure 10A. The conductive pad 30 may be made by any suitable conductive material includes but not limited to metal (e.g., copper, tantalum, titanium, molybdenum, tungsten, platinum, aluminum, hafnium, ruthenium), metal silicide (e.g., titanium silicide, cobalt silicide, nickel silicide, tantalum silicide), or metal nitride (e.g., titanium nitride, tantalum nitride). In some embodiments, the conductive pad 30 is formed by chemical vapor deposition (CVD), low pressure chemical vapor deposition (LPCVD), physical vapor deposition (PVD), atomic layer deposition, or spin-on. In some embodiments, the top surface 100 of the metallization structure 10A is a flat surface, thereby the conductive pad 30 is protruded from the structures there below.

In some embodiments, the upper passivation layer 101 is formed over the top surface 100 of the metallization structure 10A and the conductive pad 30. Because a top surface 303 of the conductive pad 30 is higher than the top surface 100 of the metallization structure 10A, therefore the upper passivation layer 101 positioned thereon is uneven and is lifted along the surface of the conductive pad 30.

In some embodiments, the material of the upper passivation layer 101 includes silicon nitride or silicon oxide with a thickness from about 2000 Å to about 3000 Å. In some embodiments, the upper passivation layer 101 is made by silicon oxide, which has a coefficient of thermal expansion (CTE) at about 5.6E-7/K. Generally, the CTEs of non-metal materials are significantly different to metal materials. For instance, the conductive pad 30 may be made by aluminum in some embodiments, which has a CTE at about 23.6E-6/K and it is greater than the CTE of the silicon oxide. In the circumstances of the CTE differs greatly between two adjacent materials, the materials may expand and contract by different amounts during the temperature variation, and therefore high stress in the structures may be created.

More precisely, the deposition temperatures in the operations of forming the layers in the semiconductor structures are usually in a level of hundreds degrees Celsius (i.e., the conductive pad made by aluminum is disposed at a temperature at about 300 degrees Celsius, and the upper passivation layer made by silicon oxide is disposed at a temperature at about 400 degrees Celsius), and the layers will be cooled down to the room temperature later. Accordingly, the two adjacent materials, for instance, the conductive pad 30 made by aluminum, may be expanded and contracted because of the dramatic change of the temperature, whereas the expansion and contraction of the upper passivation layer 101 made by silicon oxide are relatively slight. Hence, the stress, or called as passivation stress, may be significantly high in the upper passivation layer 101, especially at the regions adjacent to the foot corners of the conductive pad 30.

In order to reduce the stress at the upper passivation layer 101 and solve the issue of cracking, the present disclosure provide a semiconductor structure having a passivation layer including at least an implanted region. The implanted region of the passivation layer may include a plurality of dopants, which may change the CTE of the passivation layer and reduce the CTE differences between the passivation layer and the conductive pad there below.

Figure 2:
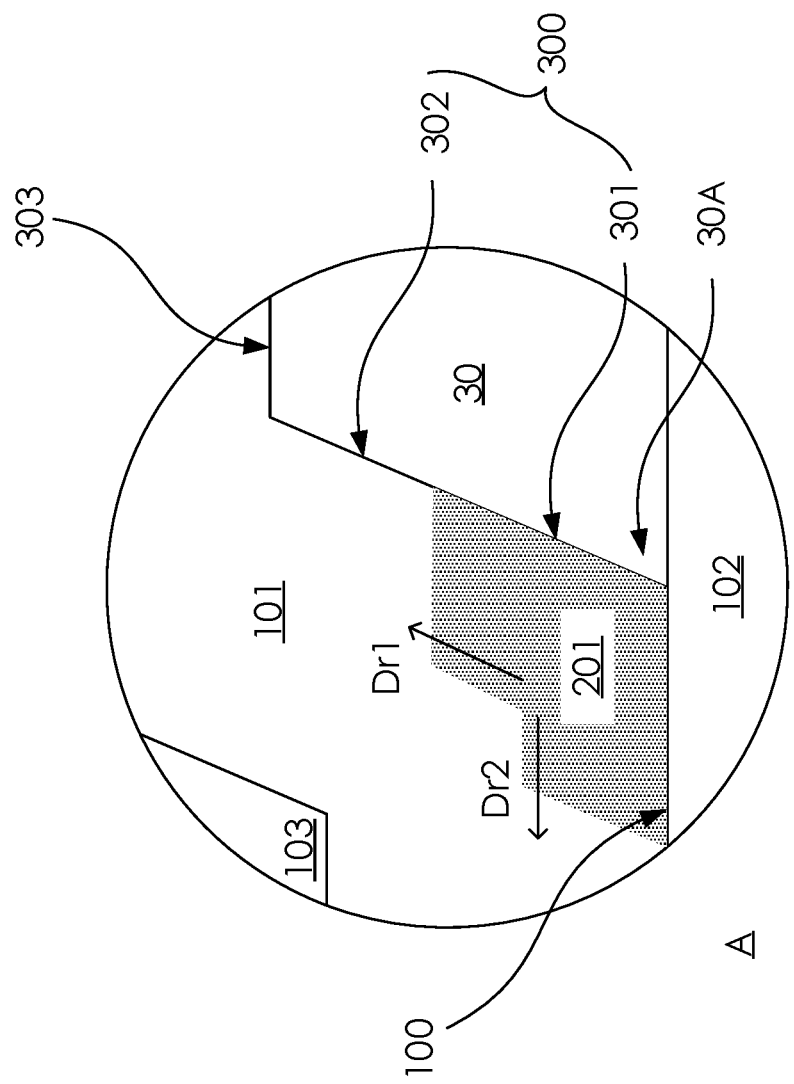
FIG. 2 illustrates an enlarged view of a portion of a semiconductor structure in FIG. 1, according to some embodiments of the present disclosure.

Referring to FIG. 2, which a cross-sectional view of the semiconductor structure enlarged from region A in FIG. 1. The upper passivation layer 101 over the top surface of the metallization structure and the conductive pad 30 includes a first implanted region 201. (In FIG. 2, a lower passivation layer 102 is already disposed on the top surface of the metallization structure, which will be described in detail later.) In some embodiments, the first implanted region 201 is at a foot corner of the conductive pad 30. The conductive pad 30 includes a sidewall 300 which may be divided into a lower sidewall 301 and an upper sidewall 302. Such sidewalls may be called as bottom sidewall and top sidewall, respectively. In some embodiments, the first implanted region 201 is adjacent to a lower sidewall 301 of the conductive pad 30. Generally, the upper passivation layer 101 near the lower sidewall 301 of the conductive pad 30 is the position where the stress is the highest and may induce the crack of the passivation material. Accordingly, in some embodiments, a plurality of dopants are implanted into the first implanted region 201. In some embodiments, the atomic order of each of the dopants is greater than the atomic order of silicon or oxygen, therefore no strong dopant diffusion occurs in the passivation layer composed of silicon oxide. In some embodiments, the CTE of the first implanted region 201 in the upper passivation layer 101 is greater than the CTE of the portion of the upper passivation layer 101 away from the first implanted region 201. In some embodiments, the CTE of the conductive pad 30 is closer to the CTE of the first implanted region 201 than to the CTE of the portion of the upper passivation layer 101 away from the first implanted region 201. In some embodiments, the CTE of the upper passivation layer 101 adjacent to the lower sidewall 301 of the conductive pad 30 is higher than the CTE of the upper passivation layer 101 adjacent to the upper sidewall 302 of the conductive pad 30.

Still referring to FIG. 2, in some embodiments, the first implanted region 201 is not only adjacent to a lower sidewall 301 of the conductive pad 30, but also covers a portion of the top surface 100 of the metallization structure 10A. In other words, both of the directions Dr1 and Dr2 according to the angle of the foot corner 30A of the conductive pad 30 are adequate for the formation of the first implanted region 201.

In some embodiments, the dopants in the first implanted region 201 include germanium. The atomic order of germanium is greater than the atomic order of silicon or oxygen, and the CTE of such region may further be increased to become closer with the CTE of the aluminum conductive pad 30 compared with the CTE of the portion away from the first implanted region 201.

Figure 3:
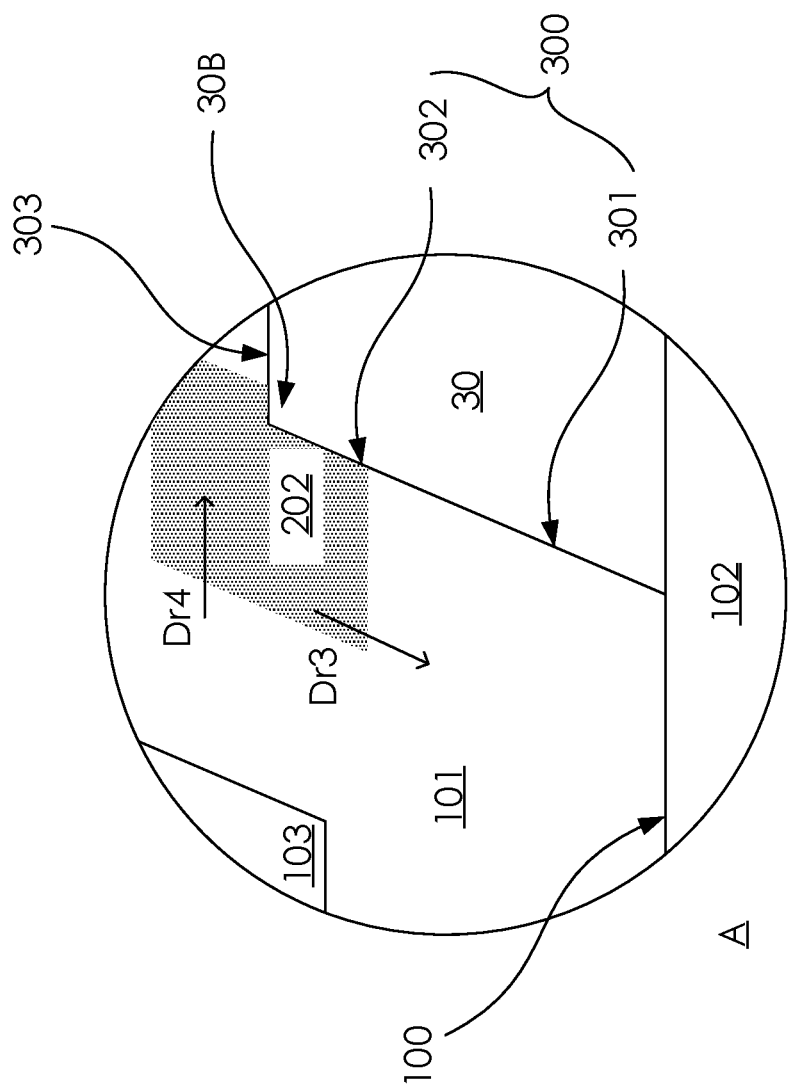
FIG. 3 illustrates an enlarged view of a portion of a semiconductor structure in FIG. 1, according to some embodiments of the present disclosure.

Referring to FIG. 3, in some embodiments, the upper passivation layer 101 further includes a second implanted region 202, which is adjacent to the upper sidewall 302 of the conductive pad 30. The features of the dopants in the second implanted region 202 are identical to the dopants in the first implanted region 201 as previously disclosed. Furthermore, in some embodiments, the second implanted region 202 is not only adjacent to the upper sidewall 302 of the conductive pad 30, but also covers a portion of the top surface 303 of the conductive pad 30. As shown in FIG. 3, both of the directions Dr3 and Dr4 according to the angle of a head corner 30B of the conductive pad 30 are adequate for the formation of the second implanted region 202.

In some embodiments, the first implanted region 201 and the second implanted region 202 simultaneously present in the upper passivation layer 101 and is connected as a contiguous implanted region.

Figure 4:
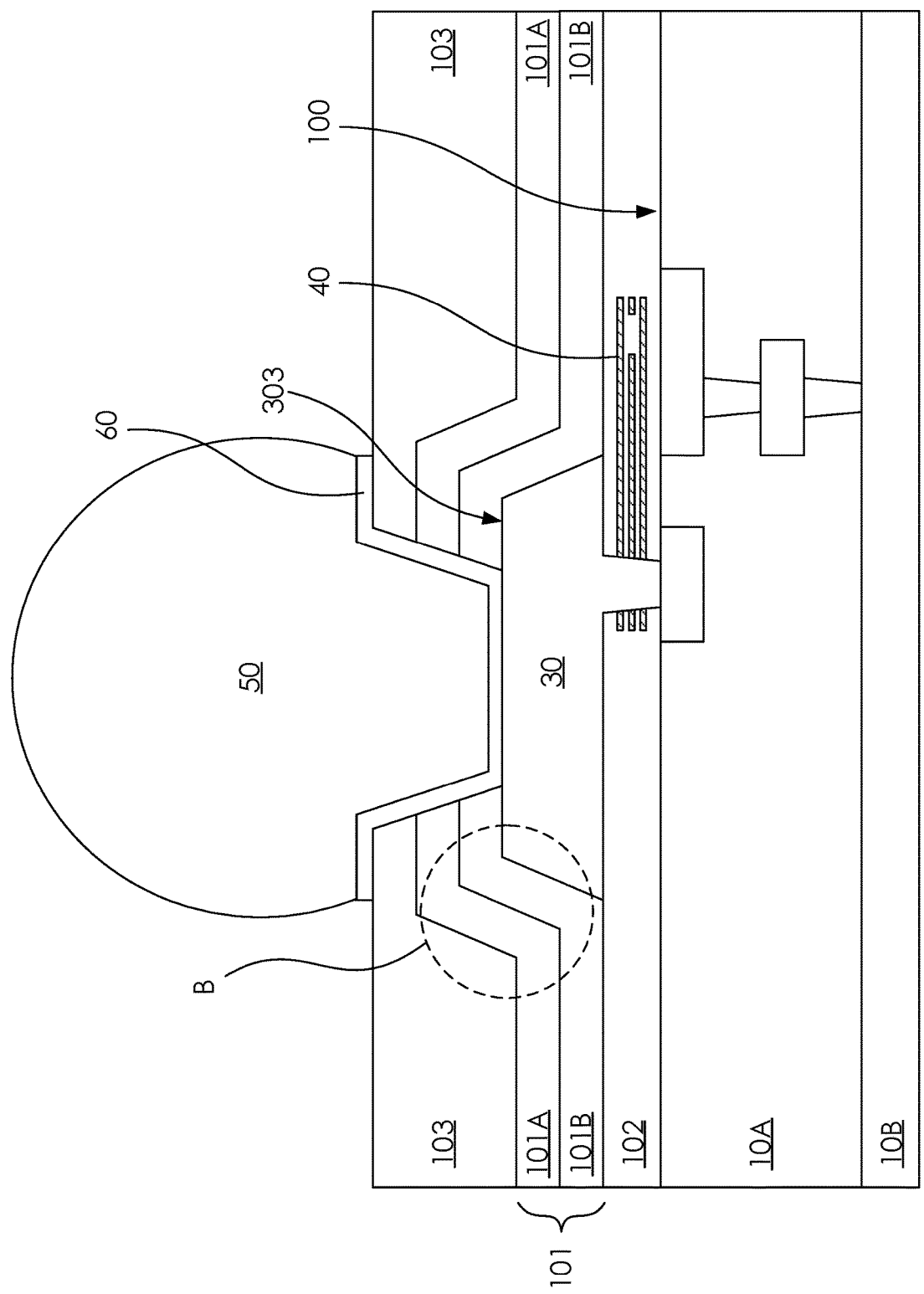
FIG. 4 illustrates a cross-sectional view of a semiconductor structure according to some embodiments of the present disclosure.

Referring to FIG. 4, in some embodiments, the upper passivation layer 101 may include a multilayer structure with at least two layers made by different materials. In some embodiments, the upper passivation layer 101 includes a nitride layer 101A and an oxide layer 101B. In some embodiments, the nitride layer 101A is made by silicon nitride, whereas the oxide layer 101B is made by silicon oxide. In some embodiments, the first implanted region 201 and the second implanted region 202 as previously shown in FIG. 2 and FIG. 3 are located in the oxide layer 101B, which is closer to the conductive pad 30 than the nitride layer 101A.

In some embodiments, the upper passivation layer 101 may further include a silicon nitride or the nitride layer 101A which is disposed over the oxide layer 101B. In some embodiments, in addition to the oxide layer 101B, the germanium-implanted region may be further located in the nitride layer 101A.

Figure 5:
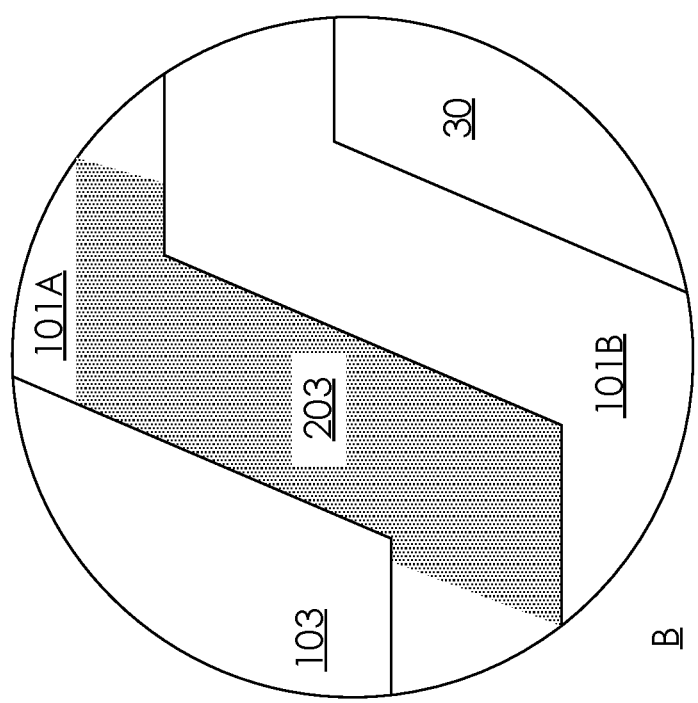
FIG. 5 illustrates an enlarged view of a portion of a semiconductor structure in FIG. 4, according to some embodiments of the present disclosure.

As shown in FIG. 5, which a cross-sectional view of the semiconductor structure enlarged from region B in FIG. 4, the nitride layer 101A covers the oxide layer 101B, and the nitride layer 101A includes the plurality of dopants. More precisely, the nitride layer 101A may include a third implanted region 203 adjacent to a portion of the oxide layer 101B. In some embodiments, the third implanted region 203 is adjacent to the first implanted region 201 and/or the second implanted region 202 previously shown in FIG. 2 and/or FIG. 3. In other words, the first implanted region 201, the second implanted region 202, and the third implanted region 203 may be formed as a continuous region in the upper passivation layer 101.

In some embodiments, the germanium concentration in the first implanted region 201 or the second implanted region 202 is in a range of from about $1.0E14/cm^3$ to about $1.0E15/cm^3$. The germanium concentration may be adjusted according to the thickness of the upper passivation layer 101. Generally, the thicker the upper passivation layer 101 is, the more germanium ions are implanted in the implanted region for reducing stress imposed on the upper passivation layer 101.

Figure 6:
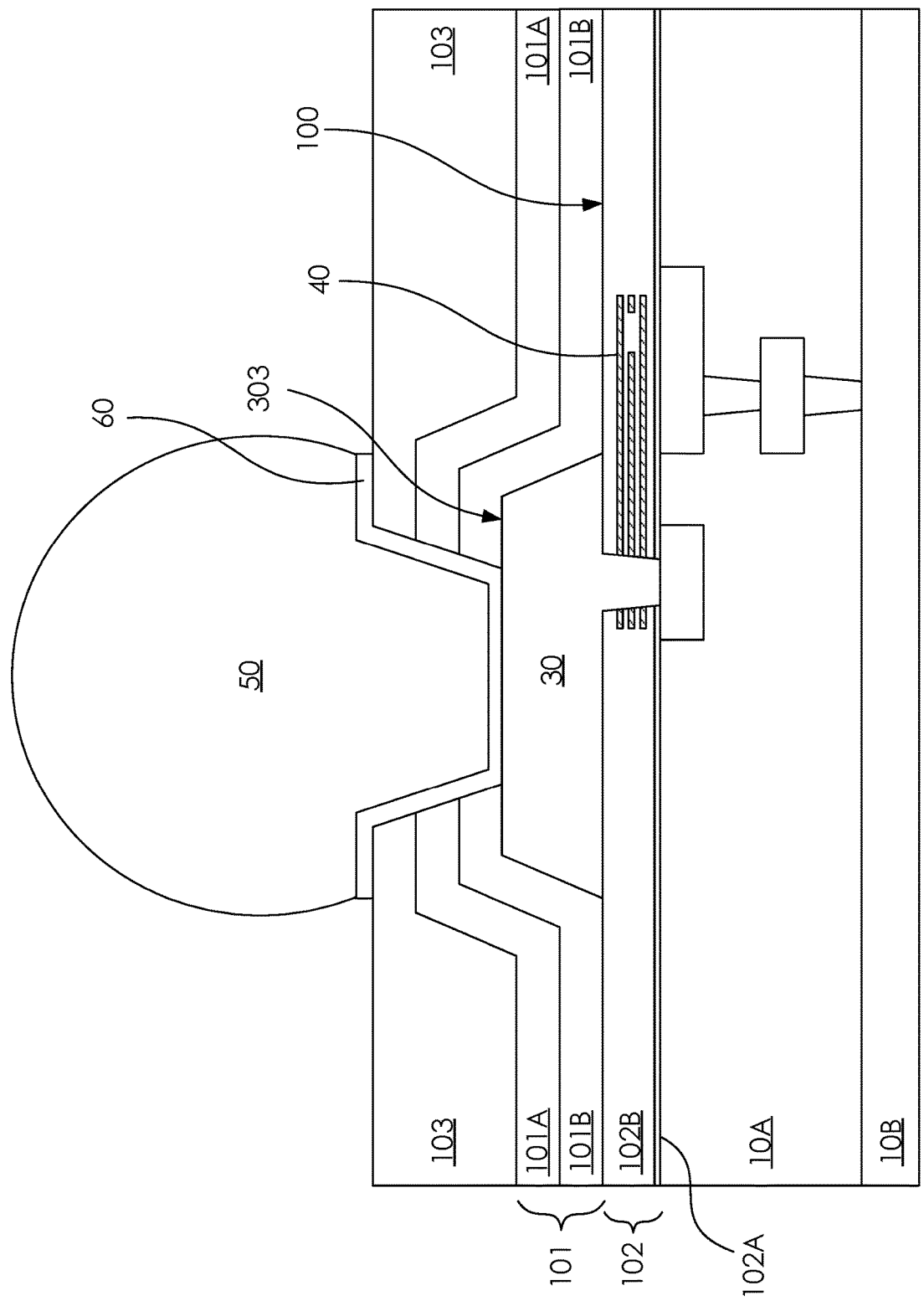
FIG. 6 illustrates a cross-sectional view of a semiconductor structure according to some embodiments of the present disclosure.

Referring to FIG. 6, in some embodiments, the semiconductor structure further includes a lower passivation layer 102 under the conductive pad 30 and the upper passivation layer 101. Different from the upper passivation layer 101, the lower passivation layer 102 is a flat layer without corners or curves as the upper passivation layer 101. Hence, unlike the upper passivation layer 101, there is less stress being imposed on the lower passivation layer 102 as a result of CTE mismatch.

In some embodiments, the lower passivation layer 102 may include a multilayer structure with at least two layers made by different materials. In some embodiments, the lower passivation layer 102 includes a nitride layer 102A and an oxide layer 102B. In some embodiments, the nitride layer 102A is made by silicon nitride, whereas the oxide layer 102B is made by silicon oxide.

In some embodiments, a passive device in the lower passivation layer 102. The passive device may be a metal-insulator-metal (MIM) structure 40, which is formed horizontally in the lower passivation layer 102 and with two metal plates sandwiching a dielectric layer parallel to the top surface 100 of the metallization structure 10A. The MIM structure 40 in the lower passivation layer 102 may be a capacitor; such capacitors have been widely used in functional circuits such as mixed-signal circuits, analog circuits, radio frequency (RF) circuits, dynamic random access memories (DRAMs), embedded DRAMs, and logic operation circuits. Conventional MIM capacitors were formed in interconnect structures, but the MIM capacitor in the present disclosure is formed in the passivation layer to save the space in the stacked layers 10A. Furthermore, although there is less passivation stress caused by the lower passivation layer 102, the passivation stress at the upper passivation layer 101 may cause the upper passivation layer 101 cracked and thereby damage the MIM structure 40 there below. Accordingly, in the present disclosure, the plurality of dopants are implanted in the upper passivation layer 101 to reduce the passivation stress and to avoid the failure of the MIM structure 40, particularly, in some embodiments, the MIM structure 40 includes a super high density MIM (SHD-MIM) structure at least partially overlapping with the conductive pad 30. In some embodiments, the conductive pad 30 is disposed over the MIM structure 40.

Referring to FIG. 1, FIG. 4 and FIG. 5, in some embodiments, the polymer layer 103 is disposed over the upper passivation layer 101 and the conductive pad 30. In some embodiments, the polymer layer 103 is made by polyimide. Polyimide has a Young's modulus at about 2.5 GPa, which is a soft material relatively. Compared to the hard materials such as silicon oxide and silicon nitride, which have Young's modulus at about 66.3 GPa and 166.0 GPa respectively, the polymer layer 103 is more elastic and there is less stress issue in this layer.

In some embodiments, the conductive via 50 is disposed over the conductive pad 30 by penetrating through the upper passivation layer 101 and the polymer layer 103, and electrically coupled to the conductive pad 30. In some embodiments, an under bump metallurgy (UBM) 60 is formed on a top surface of the conductive pad 30 and under the conductive via 50. In some embodiments, the conductive via 50 may be a solder bump, which may be further reflowed and attached to the contact pads of other electrical components, for example, attached to a PCB.

The forming of the semiconductor structure in the present disclosure may include various operations. As shown in FIG. 7A and FIG. 7B, a metallization structure 10A having a top surface 100 is provided. The metallization structure 10A may include a series of stacked layers over a substrate 10B. Next, a portion of a lower passivation layer is disposed over the top surface 100 of the metallization structure 10A. In some embodiments, such portion of the lower passivation layer is a nitride layer 102A composed of silicon nitride.

As shown in FIG. 7C and FIG. 7D, the other portion of the lower passivation layer is disposed on the nitride layer 102A. In some embodiments, such portion of the lower passivation layer is an oxide layer 102B made by silicon oxide. In some embodiments, the nitride layer 101A is formed by chemical vapor deposition (CVD), plasma-enhanced CVD, spin-on, or other applicable methods.

In some embodiments, a MIM structure 40 is formed in the lower passivation layer 102, and the forming of the oxide layer 102B may be separated in to several operations. For instance, after a first portion of the oxide layer 102B is formed on the nitride layer 102A, a capacitor bottom metal 40A is disposed thereon; next, a second portion of the oxide layer 102B and a capacitor middle metal 40B is formed afterwards; in addition, a third portion of the oxide layer 102B and a capacitor top metal 40C is formed over the capacitor middle metal 40B. Finally, the rest portion of the oxide layer 102B is formed to cover the capacitor top metal. In some embodiments, the MIM structure 40 may be a super high density MIM structure or a high density MIM structure.

In some embodiments, after the lower passivation layer 102 with the MIM structure 40 is formed, a first opening 71 is formed to expose at least a metal layer 10C at the top surface 100 of the metallization structure 10A. In some embodiment, a portion of the MIM structure 40 is etched through during the forming of the first opening 71.

As shown in FIG. 7E and FIG. 7F, a conductive pad 30 may be formed over the top surface 100 of the metallization structure 10. More precisely, in some embodiments, the conductive pad 30 may be substantially formed on the lower passivation layer 102 and electrically coupled to the metal layer 10C and the MIM structure 40 through the first opening 71. In some embodiments, the conductive pad 30 is formed by chemical vapor deposition (CVD), low pressure chemical vapor deposition, physical vapor deposition (PVD), atomic layer deposition, or spin-on. Next, a portion of the upper passivation layer is disposed over the top surface 100 and the conductive pad 30, such portion of the upper passivation layer is a oxide layer 101B made by silicon oxide.

Figure 7G:
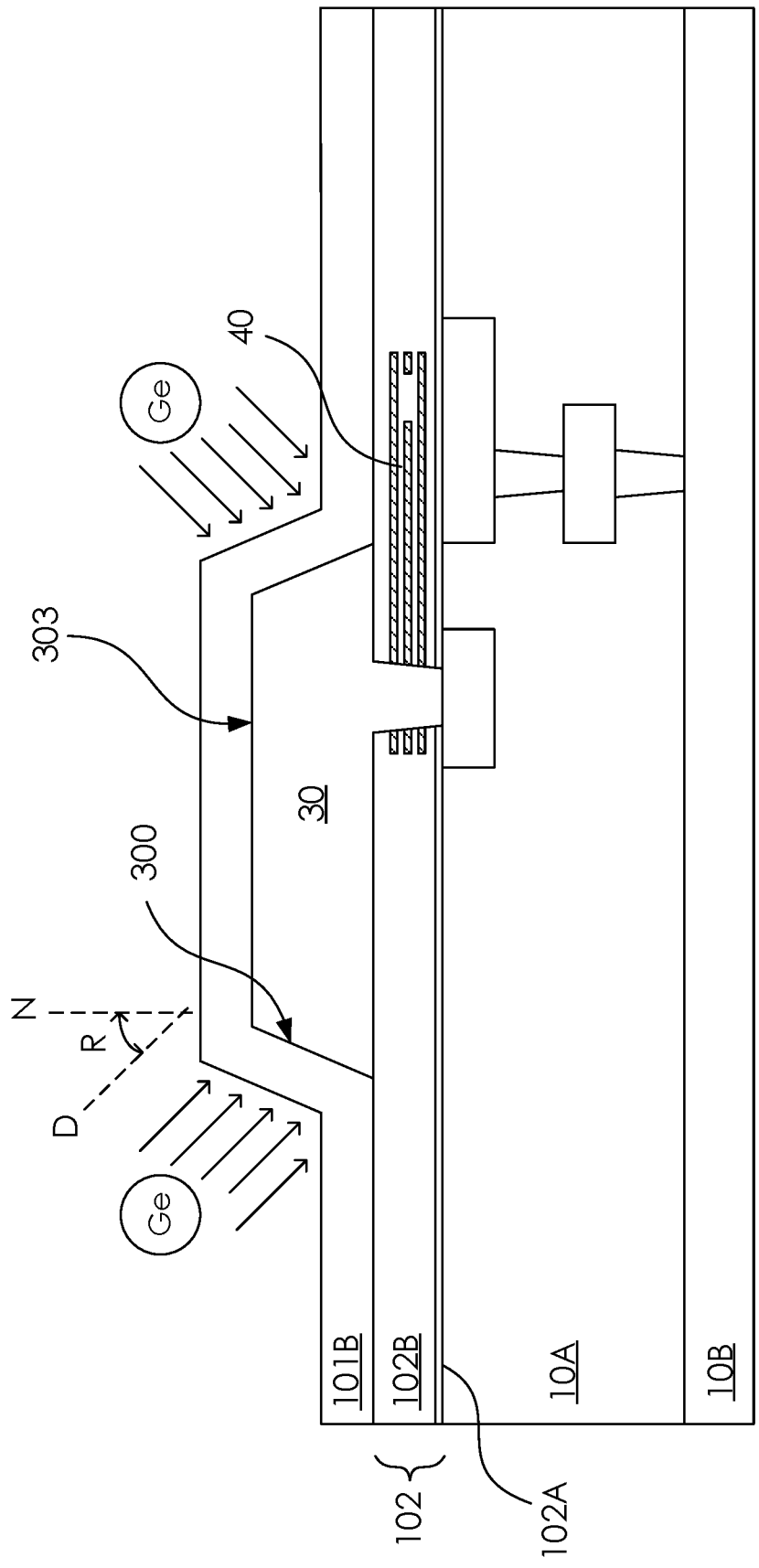

After the oxide layer 101B is formed, as shown in FIG. 7G, a plurality of dopants may be implanted into the oxide layer 101B of the upper passivation layer. As previously shown in FIG. 2 and FIG. 3, the first implanted region and the second implanted region are adjacent to the sidewall 300 of the conductive pad 30. Therefore, in some embodiments, the implanting direction may be deliberately chosen to form the implant at specific regions. As shown in FIG. 7G, an implanting angle R between an implanting direction D and a normal N of the top surface 303 is in a range of from about 40 degrees to about 50 degrees.

Figure 7H:
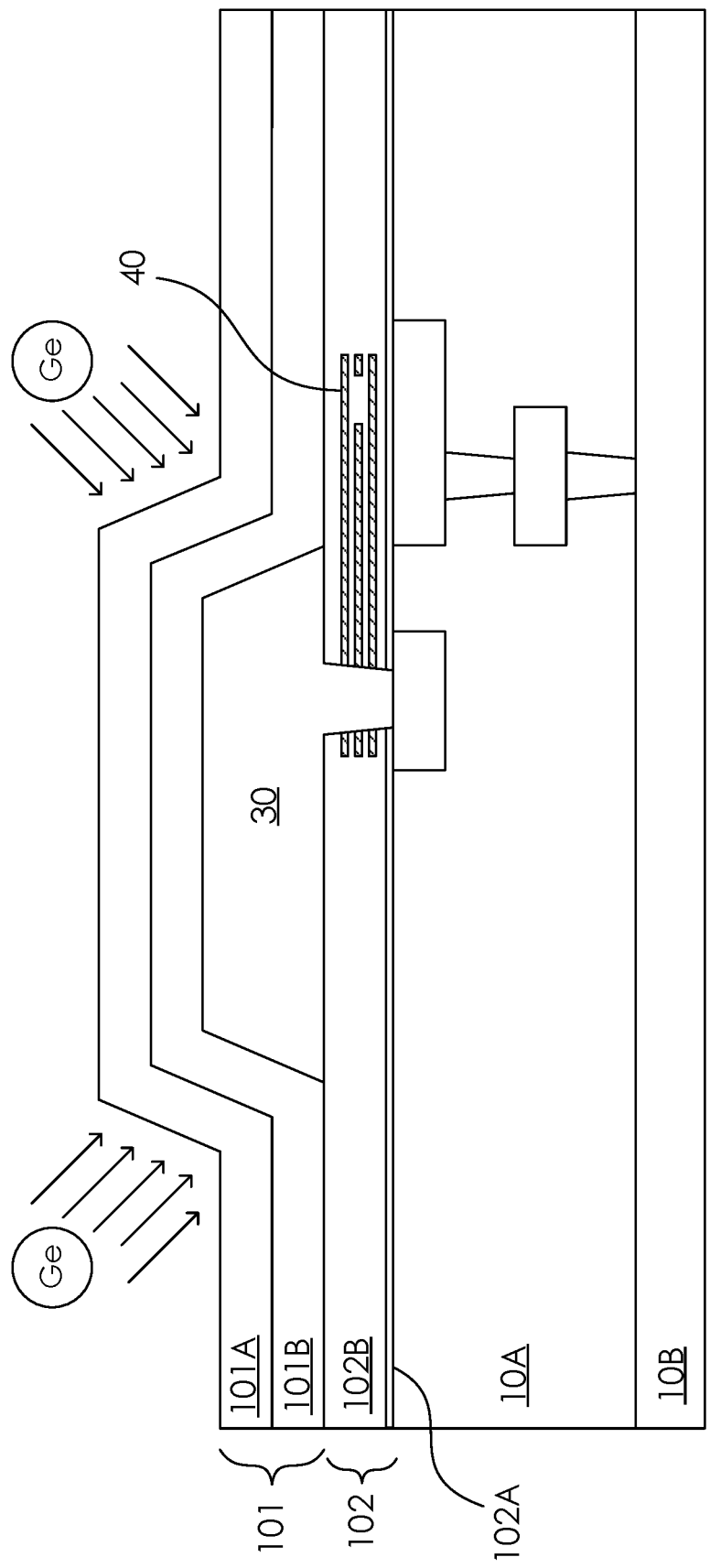

After the first implanted region and/or the second implanted region are formed in the oxide layer 101B. In some embodiments, as shown in FIG. 7H, a nitride layer 101A is disposed over the oxide layer 101B. In some embodiments, the nitride layer 101A is formed by chemical vapor deposition (CVD), plasma-enhanced CVD, spin-on, or other applicable methods. In some embodiments, a plurality of dopants may be implanted in the nitride layer 101A to form the third implanted region as previously shown in FIG. 5.

In some embodiments, the operations of implanting may be postponed until the nitride layer 101A of the upper passivation layer 101 is formed. That is, although the oxide layer 101B is already covered by the nitride layer 101A, the dopants such as germanium still may be implanted in the oxide layer 101B by controlling the implanting energy provided to the germanium ions, and thus the depth of penetration of the germanium ions may be located in the first implanted region and/or the second implanted region as previously shown in FIG. 2 and FIG. 3.

In some embodiments, the implant operations illustrated in FIG. 7G and FIG. 7H can both be carried out during the manufacturing of the semiconductor structure. In some embodiments, only the implant operation illustrated in FIG. 7G or FIG. 7H is carried out during the manufacturing of the semiconductor structure.

Figure 7I:
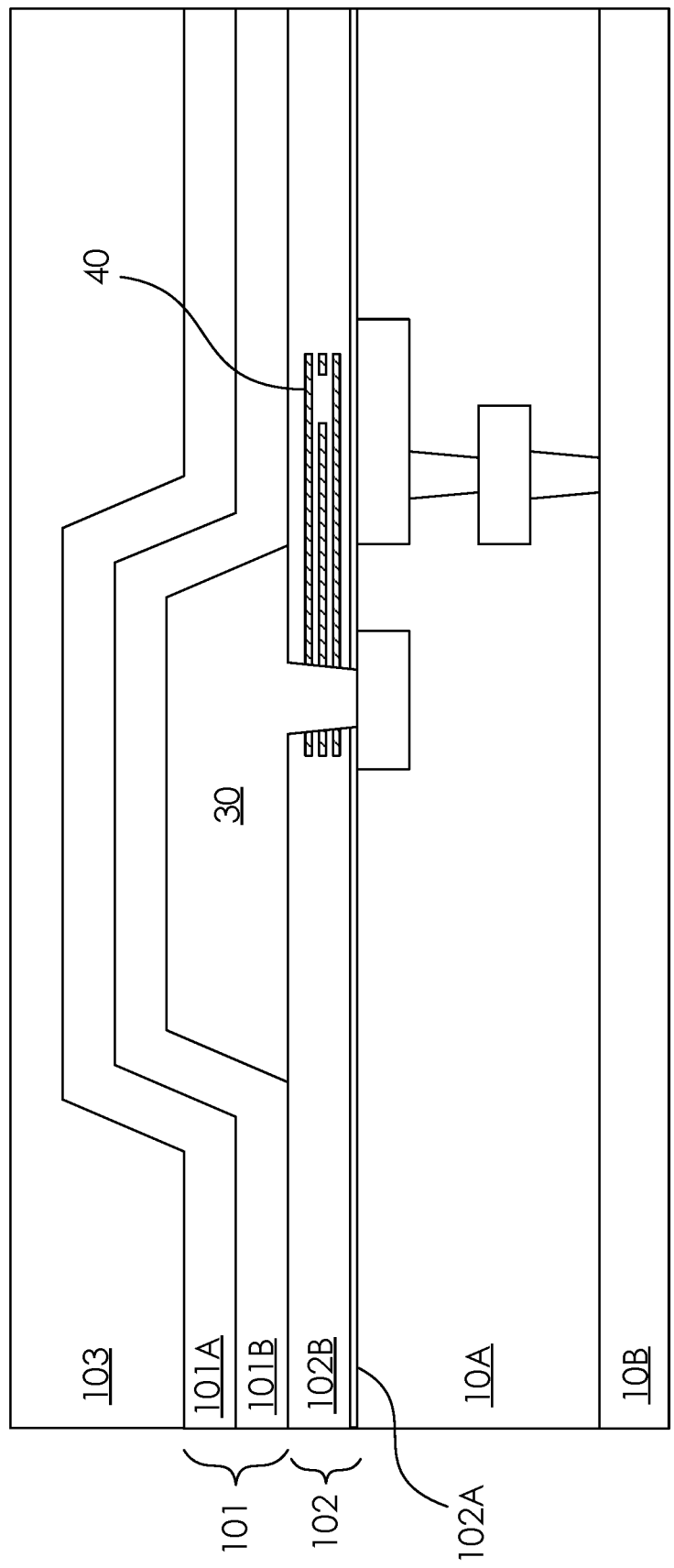

As shown in FIG. 7I, in some embodiments, the polymer layer 103 is disposed over the upper passivation layer 101 after the forming operation thereof, or after the implanting operations as aforementioned. In some embodiments, the polymer layer 103 is made by polyimide with a thickness about 50000 Å. In some other embodiments, polymer layer 103 may include some other flexible materials such as benzocyclobuten (BCB), epoxy, silicone, acrylates, siloxane, fluorinated polymer, and the like. The polymer layer 103 may be formed by using any suitable method such as spin-on techniques, and the like.

Figure 7J:
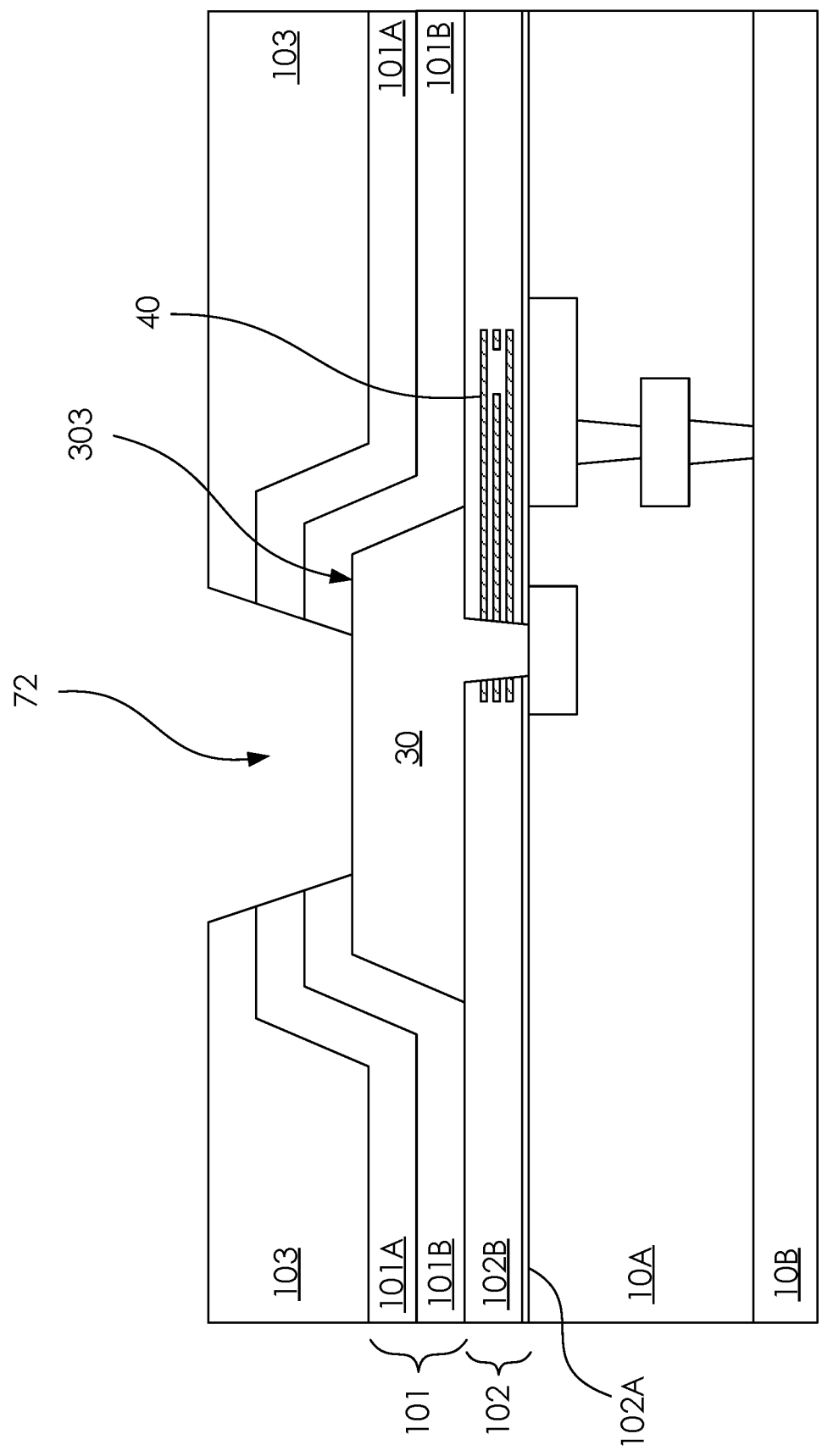

As shown in FIG. 7J, the polymer layer 103 may be patterned by a mask and implemented with an etching operation to have the second opening 72 to expose a portion of the top surface 303 of the conductive pad 30 for forming the under bump metallurgy (UBM) thereon. In such embodiments, not only the polymer layer 103, but also the upper passivation layer 101 is penetrated by the second opening 72. In some embodiments, the UBM may be formed by using a suitable process, such as electroless plating, electrochemical plating, and the like. And after the UBM is formed, the conductive via may be formed on the UBM. The structure features of the UBM and the conductive via may refer to previously shown FIG. 6.

In the present disclosure, the semiconductor structure includes at least an implanted region in the passivation layer, and such implanted region is adjacent to the sidewall of the conductive pad. The implanted region includes a plurality of dopants that may adjust the coefficient of thermal expansion (CTE) of the passivation layer. As long as the CTE difference between the passivation layer and the conductive pad is reduced, the stress imposed on the passivation layer due to the temperature variation may thus be reduced. Therefore, the passive devices such as super density metal-insulator-metal (MIM) structure underlying the conductive pad may not be damaged or failed since the crack is less likely to be generated in the passivation layer and propagate into the MIM structure.

In one exemplary aspect, a semiconductor structure is provided. The semiconductor structure includes: a metallization structure, a conductive pad, an upper passivation layer, a polymer layer, and a conductive via. The metallization structure has a top surface. The conductive pad is over the top surface. The upper passivation layer is over the top surface and the conductive pad. The upper passivation layer also includes a first implanted region. The polymer layer is over the upper passivation layer and the conductive pad. The conductive via penetrates through the upper passivation layer and the polymer layer, and electrically coupled to the conductive pad.

In another exemplary aspect, a semiconductor structure is provided. The semiconductor structure includes: a metallization structure, a metal-insulator-metal (MIM) structure, a conductive pad, an upper passivation layer, and a conductive bump. The metallization structure has a top surface. The MIM structure is over the top surface. The conductive pad is over the MIM structure. The upper passivation layer covers a sidewall of the conductive pad. The upper passivation layer also includes a plurality of dopants. The conductive bump penetrates through the upper passivation layer, and electrically coupled to the conductive pad.

In yet another exemplary aspect, a method for manufacturing a semiconductor structure is provided. The method includes the following operations. A metallization structure having a top surface is provided. A conductive pad over the top surface is formed. An upper passivation layer over the top surface and the conductive pad is formed. A plurality of dopants are implanted in a first implanted region of the upper passivation layer.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a metallization structure having a top surface;
   a conductive pad over the top surface of the metallization structure;
   an upper passivation layer over the top surface of the metallization structure, a sidewall of the conductive pad, and a top surface of the conductive pad, wherein the upper passivation layer comprises:
      a raised portion conformal to and in direct contact with the sidewall of the conductive pad, the raised portion comprising an implanted region; and
      a plain portion away from the conductive pad and being free from having the implanted region;
   a polymer layer over the upper passivation layer and the conductive pad; and
   a conductive via penetrating through the upper passivation layer and the polymer layer, electrically coupled to the conductive pad.

2. The semiconductor structure of claim 1, wherein the implanted region comprises a first implanted region adjacent to a lower sidewall of the conductive pad.

3. The semiconductor structure of claim 1, wherein the implanted region comprises a second implanted region adjacent to an upper sidewall of the conductive pad.

4. The semiconductor structure of claim 1, further comprising a lower passivation layer under the conductive pad and the upper passivation layer.

5. The semiconductor structure of claim 4, further comprising a passive device in the lower passivation layer.

6. The semiconductor structure of claim 1, wherein the upper passivation layer comprises an oxide layer and a nitride layer.

7. The semiconductor structure of claim 1, wherein a coefficient of thermal expansion (CTE) of the conductive pad is closer to a CTE of the implanted region than to a CTE of the upper passivation layer away from the implanted region.

8. The semiconductor structure of claim 1, wherein the implanted region comprises germanium, and a concentration of the germanium in the implanted region is in a range of from about $1.0E14/cm^3$ to about $1.0E15/cm^3$.

9. A semiconductor structure, comprising:
   a metallization structure having a top surface;
   a metal-insulator-metal (MIM) structure over the top surface;
   a conductive pad over the MIM structure;
   an upper passivation layer covering a sidewall of the conductive pad, the upper passivation layer comprises:
      a raised portion conformal to and in direct contact with the sidewall of the conductive pad, the raised portion comprising a plurality of dopants; and
      a plain portion away from the conductive pad and being free from having the plurality of dopants; and
   a conductive bump penetrating through the upper passivation layer, electrically coupled to the conductive pad.

10. The semiconductor structure of claim 9, wherein the upper passivation layer further comprises a silicon oxide layer in contact with the sidewall of the conductive pad.

11. The semiconductor structure of claim 10, wherein an atomic order of each of the plurality of dopants is greater than an atomic order of silicon or oxygen.

12. The semiconductor structure of claim 10, wherein the upper passivation layer further comprises a silicon nitride layer covering the silicon oxide layer, the silicon nitride layer comprises the plurality of dopants.

13. The semiconductor structure of claim 9, wherein the plurality of dopants are located adjacent to a bottom sidewall of the conductive pad.

14. The semiconductor structure of claim 9, wherein the MIM structure comprises a super high density MIM structure at least partially overlapping with the conductive pad.

15. A method for manufacturing a semiconductor structure, comprising:
   providing a metallization structure having a top surface;
   forming a conductive pad over the top surface;
   forming an upper passivation layer over the top surface of the metallization structure and the conductive pad, and the upper passivation layer comprises a raised portion conformal to and in direct contact with a sidewall of the conductive pad, and a plain portion away from the conductive pad; and
   implanting a plurality of dopants only in the raised portion of the upper passivation layer.

16. The method of claim 15, wherein an implanting angle between an implanting direction and a normal of the top surface is in a range of from about 40 degrees to about 50 degrees.

17. The method of claim 15, further comprising:
- forming an opening over the conductive pad and penetrating through the upper passivation layer; and
- forming a conductive bump in the opening and electrically coupled to the conductive pad.

18. The method of claim 15, wherein forming the upper passivation layer comprises:
- forming an oxide layer over the conductive pad;
- implanting the plurality of dopants in the oxide layer; and
- forming a nitride layer over the oxide layer.

19. The method of claim 18, further comprising:
- implanting the plurality of dopants in the nitride layer.

20. The method of claim 15, further comprising:
- forming a lower passivation layer prior to forming the conductive pad, the lower passivation layer comprising a high density metal-insulator-metal (MIM) structure.

\* \* \* \* \*